(12) United States Patent
Sawai et al.

(10) Patent No.: US 8,110,756 B2
(45) Date of Patent: Feb. 7, 2012

(54) ELECTRONIC DEVICE

(75) Inventors: Jun Sawai, Kanagawa (JP); Munetoshi Miyahara, Kanagawa (JP)

(73) Assignee: Sony Corporation, Tokyo (JP)

( * ) Notice: Subject to any disclaimer, the term of this patent is extended or adjusted under 35 U.S.C. 154(b) by 296 days.

(21) Appl. No.: 12/355,090

(22) Filed: Jan. 16, 2009

(65) Prior Publication Data

US 2009/0195972 A1   Aug. 6, 2009

(30) Foreign Application Priority Data

Feb. 5, 2008   (JP) .................. 2008-025147

(51) Int. Cl.
*H05K 7/14* (2006.01)

(52) U.S. Cl. .................. 174/535; 174/138 G; 361/809

(58) Field of Classification Search ............. 174/138 G, 174/535; 361/752, 809
See application file for complete search history.

(56) References Cited

U.S. PATENT DOCUMENTS

| 6,683,789 | B1 | 1/2004 | Sheynis et al. | |
| 6,943,292 | B2 * | 9/2005 | Dingman | 174/535 |

FOREIGN PATENT DOCUMENTS

| CN | 1781351 A | 5/2006 |
| JP | 9-260871 | 10/1997 |
| JP | 2004-349297 | 12/2004 |
| JP | 2007-48914 | 2/2007 |

OTHER PUBLICATIONS

Dictionary definition for the word "center" by Farlex (online edition) Aug. 10, 2011.*
Office Action issued Oct. 9, 2010, in China Patent Application No. 200910130753.3.

* cited by examiner

*Primary Examiner* — Hung Ngo
(74) *Attorney, Agent, or Firm* — Oblon, Spivak, McClelland, Maier & Neustadt, L.L.P.

(57) ABSTRACT

An electronic device includes a housing and a positioning portion. The housing includes a first member secured to the housing and a second member secured to the first member. The positioning portion is configured to position the second member at a predetermined position relative to the first member when the second member is secured to the first member in an assembly process of the electronic device.

14 Claims, 10 Drawing Sheets

ELECTRONIC DEVICE

CROSS REFERENCES TO RELATED APPLICATIONS

The present invention contains subject matter related to Japanese Patent Application JP 2008-025147 filed in the Japanese Patent Office on Feb. 5, 2008, the entire contents of which are incorporated herein by reference.

BACKGROUND OF THE INVENTION

1. Field of the Invention

The present invention generally relates to electronic devices. More particularly, the present invention relates to an electronic device that makes it easy to assemble members disposed in a housing.

2. Description of the Related Art

Typically, in cases in which a plate member, such as a substrate, is disposed in a housing, for example, in the case of an electronic device, various substrate securing methods are conceived (e.g., Japanese Unexamined Patent Application Publication Nos. 09-260871 and 2007-48914).

For example, Japanese Unexamined Patent Application Publication No. 09-260871 discloses a method for positioning and supporting a wiring substrate by directly providing a protrusion on the bottom plate of a device main unit and fitting the protrusion into a hole provided at an approximate center of the wiring substrate. Japanese Unexamined Patent Application Publication No. 2004-349297 discloses a mechanism in which the positioning of a jack substrate is performs by a rear panel and a protrusion.

In such a device in which a plate member (a first member) is disposed in a housing, a second member may be secured to a surface of the first member, the surface being a reverse side viewed from the worker (hereinafter, the surface may be referred to as a "back surface") when the first member is disposed in the housing.

FIG. 1 is a sectional view showing an example of the configuration of an electronic device having such an internal structure.

In FIG. 1, an electronic device 10 has a substrate 11 in its housing 20. An IC (integrated circuit) 12 is provided on a surface of the substrate 11, the surface being an upper side thereof in FIG. 1. A reinforcing plate 13 is attached to a position that lies at a lower surface (in FIG. 1) of the substrate 11 and that corresponds to the IC 12, so as to prevent the substrate 11 from bending that puts a load on contacts (terminals) of the IC 12, when the housing 20 is vibrated or is given a shock. A surface of the reinforcing plate 13, the surface being adjacent to the substrate 11, has mold portions 14 (14A to 14D) so as to prevent damage to the substrate 11.

A heat sink 15 is attached to an upper surface (in FIG. 1) of the IC 12 in order to release heat generated by the IC 12. The heat sink 15 is secured to the substrate 11 by heat-sink screws 16A and 16B. The heat-sink screws 16A and 16B also secure the reinforcing plate 13 through the substrate 11. The substrate 11 to which the heat sink 15 and the reinforcing plate 13 are secured is secured to substrate attachment supports 21A and 21B of the housing 20 by substrate screws 22A and 22B, respectively.

When a second substrate is secured to a predetermined position at the back surface of a first member rather than to a housing, as described above, the position of the first member and the position of the second member are generally aligned with each other. In this case, however, it is difficult to use the methods disclosed in Japanese Unexamined Patent Application Publication Nos. 09-260871 and 2004-349297, since these are methods for performing positioning between a substrate and a housing.

In particular, when a first member is placed on a second member that is smaller than the first member and the second member is hidden and made invisible by the first member, it is difficult to accurately control the relative position between the first member and the second member and it is thus difficult to accurately secure the second member to a predetermined position at the back surface of the first substrate.

In such a case, a method is conceivable in which, before the first member is disposed in the housing, the first member is turned upside down so that the back surface becomes the obverse surface and the second member is attached thereto. However, changing the working surface, for example, from the obverse surface to the back surface by reversing the first member in such a manner not only makes the work complicated but also can cause forgetting to attach the second member and cause damage to the first member during the change of the working surface. Thus, such a method is not desirable.

Assembly in such a case has been typically performed using, for example, a predetermined jig 30, as shown in FIGS. 2A and 2B. As shown in FIG. 2A, the jig 30 has reinforcing-plate positioning pins 31A and 31B for placing a reinforcing plate 13 at a predetermined position and substrate positioning pins 32A and 32B for placing the substrate 11 at a predetermined position.

As shown in FIG. 2A, a worker places the reinforcing plate 13 on the jig 13 so that the reinforcing-plate positioning pints 31A and 31B are inserted into reinforcing-plate positioning holes 41A and 41B provided in the reinforcing plate 13. Next, as shown in FIG. 2B, the worker places the substrate 11 on the jig 30 so that the substrate positioning pins 32A and 32B are inserted into substrate positioning holes 42A and 42B provided in the substrate 11. In addition, the worker places the heat sink 15 on the IC 12 provided on the substrate 11 and secures the heat sink 15 to the substrate 11 by using the heat-sink screws 16A and 16B. At this point, as shown in FIG. 2C, the reinforcing plate 13 that is situated below the IC 12 at the reverse side of the substrate 11 is also secured to the heat-sink screws 16A and 16B that penetrate the substrate 11.

When the substrate 11 is assembled as shown in FIG. 2C, the worker removes the jig 30 from the substrate 11, locates the housing 20 on a workbench instead of the jig 30 or moves the assembled substrate 11 to a housing-assembly line, and disposes the substrate 11 at a predetermined position in the housing 20 by using the substrate screws 22A and 22B. That is, the worker places the substrate 11 on the housing 20 so that the substrate positioning holes 42A and 42B, provided in the substrate 11, are positioned above the substrate positioning pins 32A and 32B, secures the substrate 11 to the substrate positioning pin 32A by screwing the substrate screw 22A into the substrate positioning hole 42A from the upper surface of the substrate 11, and also secures the substrate 11 to the substrate positioning pin 32B by screwing the substrate screw 22B into the substrate positioning hole 42B from the upper surface of the substrate 11.

Japanese Unexamined Patent Application Publication No. 2007-48914 discloses a configuration that is similar to the configuration shown in FIG. 1. In the disclosed configuration, a heat releasing plate is disposed below a heat releasing sheet provided on the lower surface of an IC, long screws are inserted into a bottom chassis from the lower surface thereof toward the heat releasing plate, ends of the long screws are in contact with the lower surface of the heat releasing plate, and position-alignment depressions into which the ends of the long screws are inserted are formed in the lower surface of the heat releasing plate.

For example, although no specific description has been given, some methods are conceivable. For example, the heat releasing plate is placed on a workbench upside down relative to that of the heat releasing plate shown in FIG. 3 in Japanese Unexamined Patent Application Publication No. 2007-48914, the bottom chassis is placed over the heat releasing plate upside down relative to that of the bottom chassis shown in FIG. 3 in Publication No. 2007-48914, the heat releasing plate is secured to the bottom chassis by screwing the long screws from the lower surface of the bottom chassis in FIG. 3 in Publication No. 2007-48914 (i.e., the upper surface thereof, in practice), the resulting structure is then turned upside down, and the substrate is secured to the bottom chassis, as in FIG. 1 in Publication No. 2007-48914. Alternatively, the heat releasing plate is first placed on the bottom chassis, the substrate is placed thereon and is secured thereto, the resulting structure is then turned upside down, and the heat releasing plate is secured to the bottom chassis from the lower surface of the bottom chassis in FIG. 3 in Publication No. 2007-48914 (i.e., the upper surface thereof, in practice).

SUMMARY OF THE INVENTION

In the method shown in FIGS. 2A to 2D, since the jig 30 that is not a portion of a completed product is used during the assembly work of the substrate, the substrate assembly process is performed in addition to the process for disposing the substrate in the housing. Moreover, the method involves arrangements, such as management of jigs, a storage place of the jigs, provision of a work place, preparation, and cleanup, and thus increases the time and space for the work. As a result, the production cost may increase.

Since the above-described method disclosed in Japanese Unexamined Patent Application Publication No. 2007-48914 involves reversing of the bottom chassis, the work becomes complicated and thus may cause damage and cause forgetting to perform work processes. The method may also cause position displacement of the heat releasing plate during the reversal of the bottom chassis.

Accordingly, it is desirable to make it easy to assemble members disposed in a housing and to make it possible to reduce cost and work hours.

According to an embodiment of the present invention, there is provided an electronic device. The electronic device includes: a housing including a first member secured to the housing and a second member secured to the first member; and positioning means for positioning the second member at a predetermined position relative to the first member when the second member is secured to the first member in an assembly process of the electronic device.

The positioning means may include first positioning means for positioning the first member at a predetermined position relative to the housing, and second positioning means for positioning the second member at the predetermined position relative to the first member positioned at the predetermined position relative to the housing by the first positioning means.

The first positioning means may include a securing base that performs positioning on the first member when the first member is secured to the securing base, and the second positioning means may include a placement base that performs positioning in a first direction on the second member when the second member is placed on the placement base and a protrusion that performs positioning in a second direction on the second member when the protrusion is fitted into a hole provided in the second member. The second direction is perpendicular to the first direction.

The positioning means may be formed by processing the housing.

The positioning means may be formed as a portion that is independent from the housing and that is disposed in the housing.

According to the embodiment of the present invention, the second member is positioned at a predetermined position relative to the first member when the second member is secured to the first member in an assembly process of the electronic device.

According to the present invention, it is possible to make it easy to assemble members disposed in a housing and it is possible to reduce cost and work hours.

DESCRIPTION OF THE PREFERRED EMBODIMENT

Figure 1:
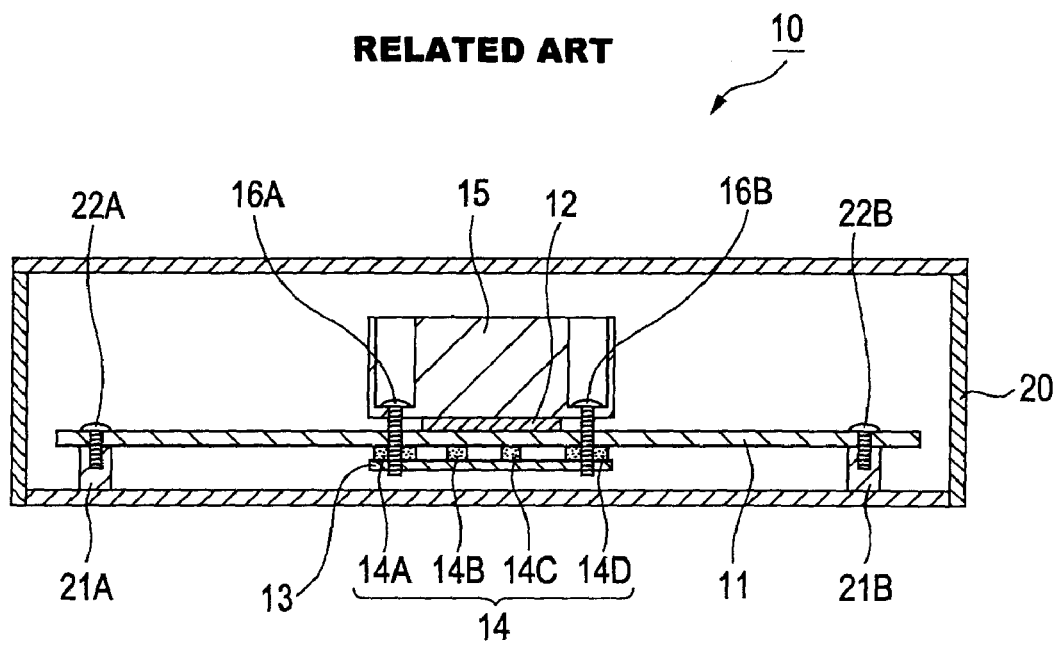
FIG. 1 is a sectional view showing an example of the internal structure of an electronic device of related art.
Figure 2A:
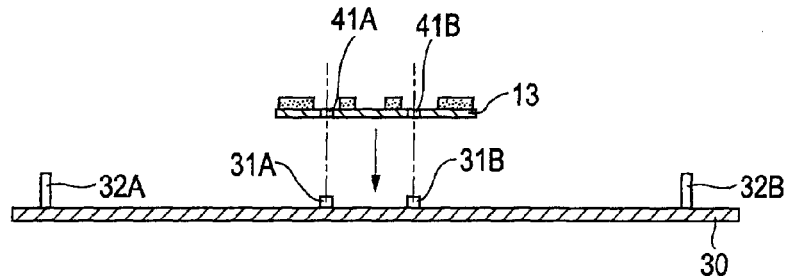
FIGS. 2A to 2D are sectional views illustrating assembly of an electronic device of the related art.
Figure 2B:
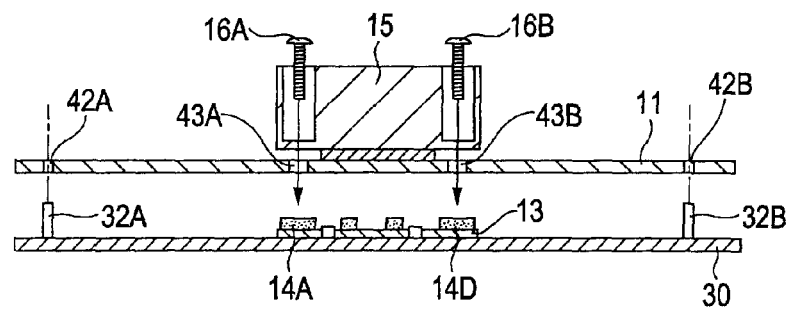
Figure 2C:
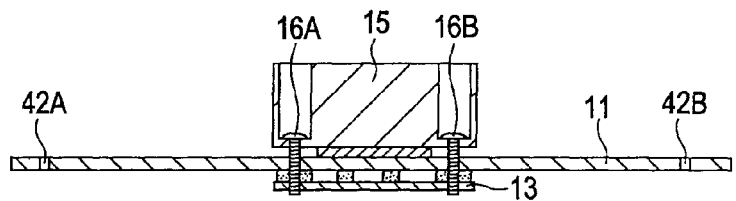
Figure 2D:
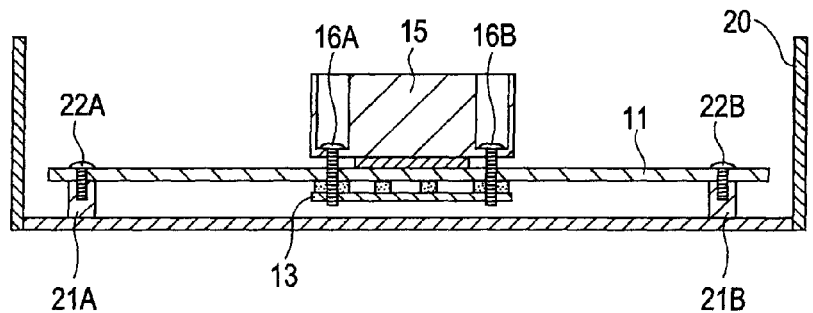
Figure 3:
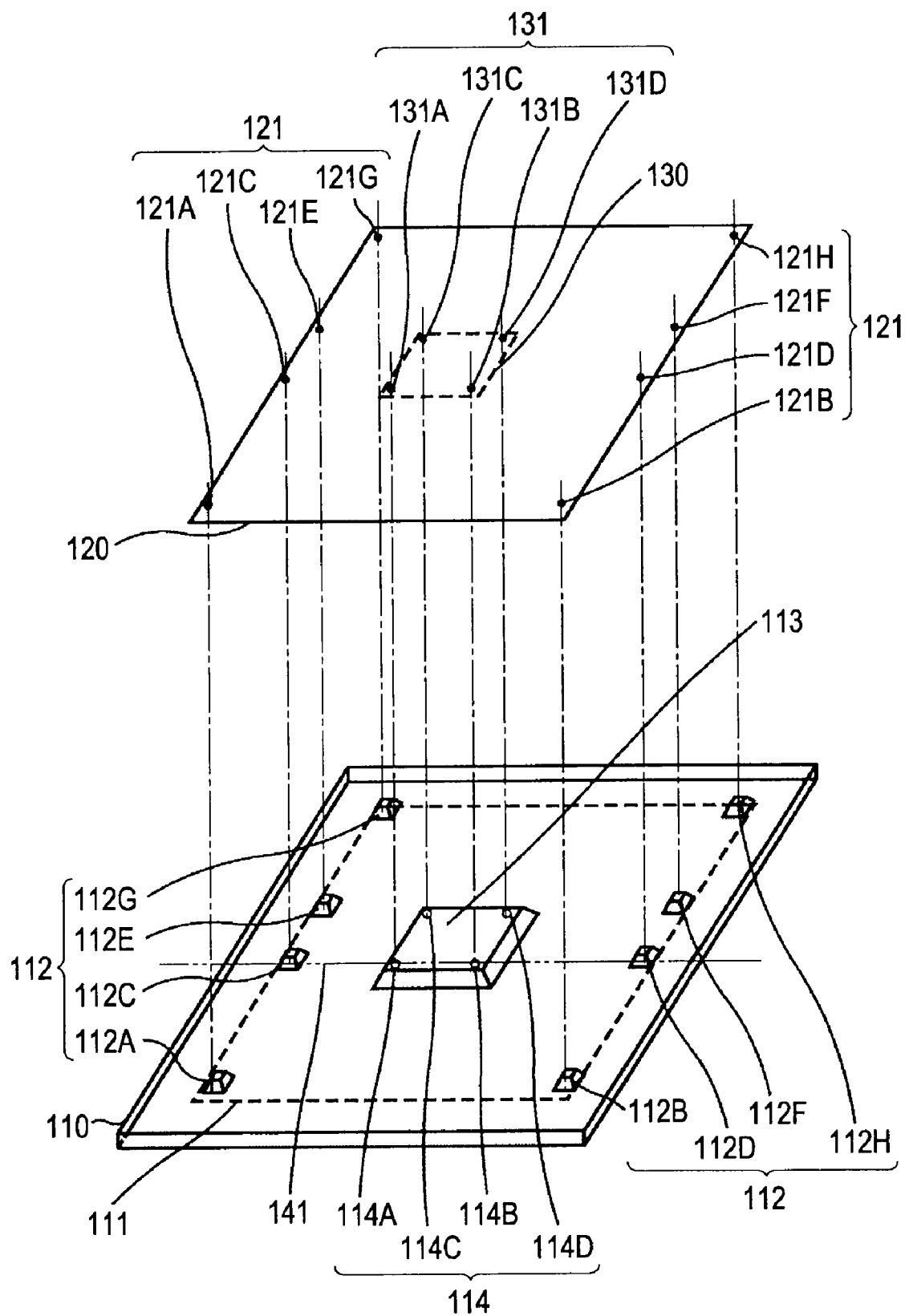
FIG. 3 is a perspective view showing an example of the internal configuration of an electronic device according to an embodiment of the present invention.

FIG. 3 is a perspective view showing an example of a major configuration of an electronic device according to an embodiment of the present invention. In the electronic device shown in FIG. 3, an electronic component and so including an IC (integrated circuit) and so on are attached to a substrate 120, which is a plate member, to provide a predetermined electronic circuit. The substrate 120 is disposed at a substrate attachment position 111 (indicated by a dotted line in FIG. 3) inside a housing 110.

Substrate securing bases 112A to 112H and a reinforcing-plate placement base 113 are provided at the substrate attachment position 111. The substrate securing bases 112A to 112H are bases on which the substrate 120 is placed and are used to secure the substrate 120 to the housing 110. During assembly, a reinforcing plate 130 secured to a lower surface (in the figure) of the substrate 120, the surface being adjacent to the housing 110, is placed on the reinforcing-plate placement base 113.

The substrate securing bases 112A to 112H are bases for placing the substrate 120 at a predetermined horizontal position inside the housing 110 and at a predetermined height (at a vertical position) from a bottom face of the housing 110. That is, the substrate securing bases 112A to 112H are members for positioning, when the substrate 120 is secured thereto, the substrate 120 at a predetermined position in the housing 110 (i.e., for controlling the vertical and horizontal positions of the substrate 120). In other words, the substrate securing bases 112A to 112H perform vertical and horizontal positioning of the substrate 120 relative to the housing 110.

Figure 6A:
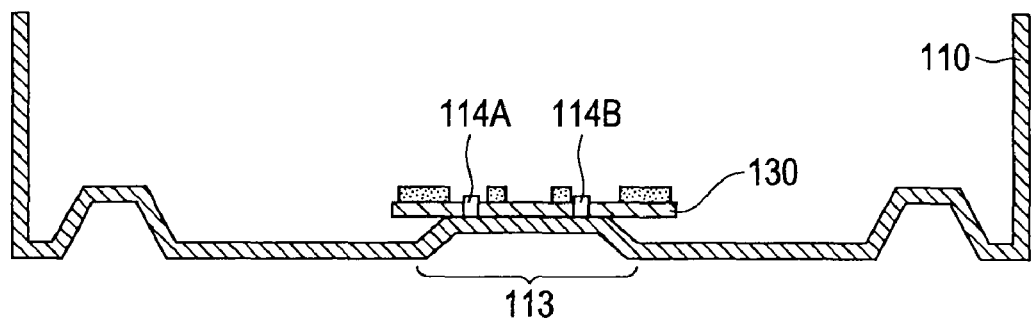
FIGS. 6A to 6C are cross sectional views illustrating an example of assembly of the electronic device shown in FIG. 5.
Figure 6B:
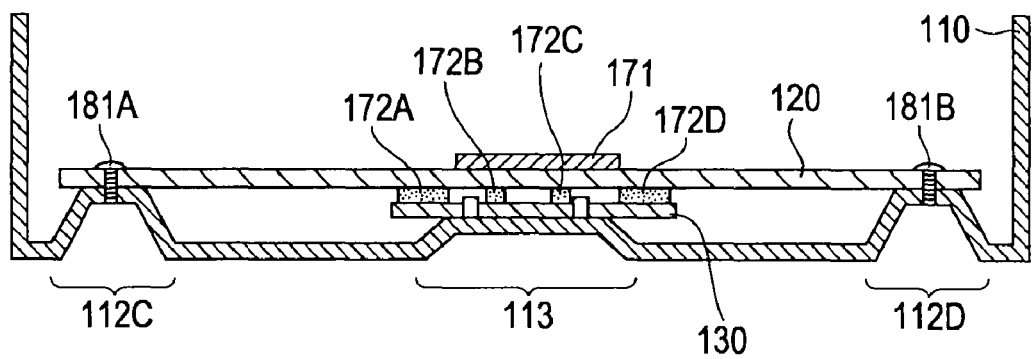
Figure 6C:
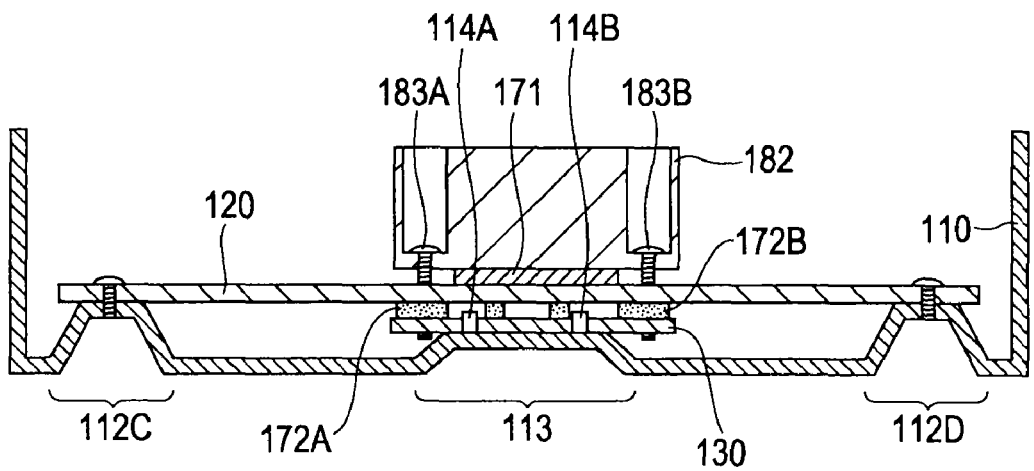

For example, as shown in FIGS. 6A to 6C, in practice, the substrate securing bases 112A to 112H control not only the position of the substrate 120 but also the posture (including an orientation and an angle) thereof relative to the housing 110. That is, the term "position" also includes such a posture (including an orientation and an angle). Thus, for example, the term "positioning" refers to not only aligning a position but also adjusting a posture including an orientation, an angle, and so on. The same applies to other descriptions below.

The substrate 120 has substrate securing holes 121A to 121H. The substrate securing bases 112A to 112H are provided at positions such that, when the substrate 120 is disposed (secured) at a predetermined height at the substrate attachment position 111, upper surfaces of the substrate securing bases 112A to 112H match the corresponding substrate securing holes 121A to 121H, as indicated by dashed-dotted lines. The substrate securing bases 112A to 112H will hereinafter be referred to as "substrate securing bases 112", unless distinction should be made therebetween. Similarly, the substrate securing holes 121A to 121H will hereinafter be referred to as "substrate securing holes 121", unless distinction should be made therebetween.

The reinforcing-plate placement base 113 is provided at a position where, when the substrate 120 is located at the substrate attachment position 111, the reinforcing plate 130 secured to the substrate 120 matches the reinforcing-plate placement base 113. During an assembly process, the reinforcing-plate placement base 113 is a base on which the reinforcing plate 130 before it is secured to the substrate 120 is located. That is, when the reinforcing plate 130 is placed on the reinforcing-plate placement base 113, the reinforcing-plate placement base 113 serves as a member for positioning the reinforcing plate 130 at a predetermined height in the housing 110 (i.e., for controlling the vertical position of the reinforcing plate 130). In other words, the reinforcing-plate placement base 113 performs vertical positioning of the reinforcing plate 130 relative to the substrate 120.

Reinforcing-plate positioning dowels 114A to 114D are provided at an upper surface of the reinforcing-plate placement base 113 so that the reinforcing plate 130 placed on the reinforcing-plate placement base 113 is positioned at a predetermined position. The reinforcing-plate positioning dowels 114A to 114D are protrusions that can be fitted into corresponding reinforcing-plate positioning holes 131A to 131D provided in the reinforcing plate 130. The reinforcing-plate positioning dowels 114A to 114D are disposed so as to position the reinforcing plate 130 placed on the reinforcing-plate placement base 113 at a predetermined position in the housing 110 (i.e., so as to control the horizontal position of the reinforcing plate 130) when the reinforcing-plate positioning dowels 114A to 114D are fitted into the corresponding reinforcing-plate positioning holes 131A to 131D, as indicated by dashed-dotted lines. That is, the reinforcing-plate positioning dowels 114A to 114D perform horizontal positioning of the reinforcing plate 130 relative to the substrate 120.

The reinforcing-plate positioning dowels 114A to 114D are hereinafter referred to as "reinforcing-plate positioning dowels 114", unless distinction should be made therebetween. Similarly, the reinforcing-plate positioning holes 131A to 131D are hereinafter referred to as "reinforcing-plate positioning holes 131", unless distinction should be made therebetween.

As described above, in the housing 110, not only can the substrate securing bases 112 secure the substrate 120 to the predetermined substrate attachment position 111, but also the reinforcing-plate positioning dowels 114 of the reinforcing placement base 113 can position, at a predetermined position, the reinforcing plate 130 attached to the back surface (the lower surface) of the substrate 120. That is, the housing 110 allows the positional relationship between the reinforcing plate 130 and the substrate 120 to be put into a predetermined state. In this state, a worker can easily secure the reinforcing plate 130 to a predetermined position of the substrate 120 without using a jig.

Figure 4A:
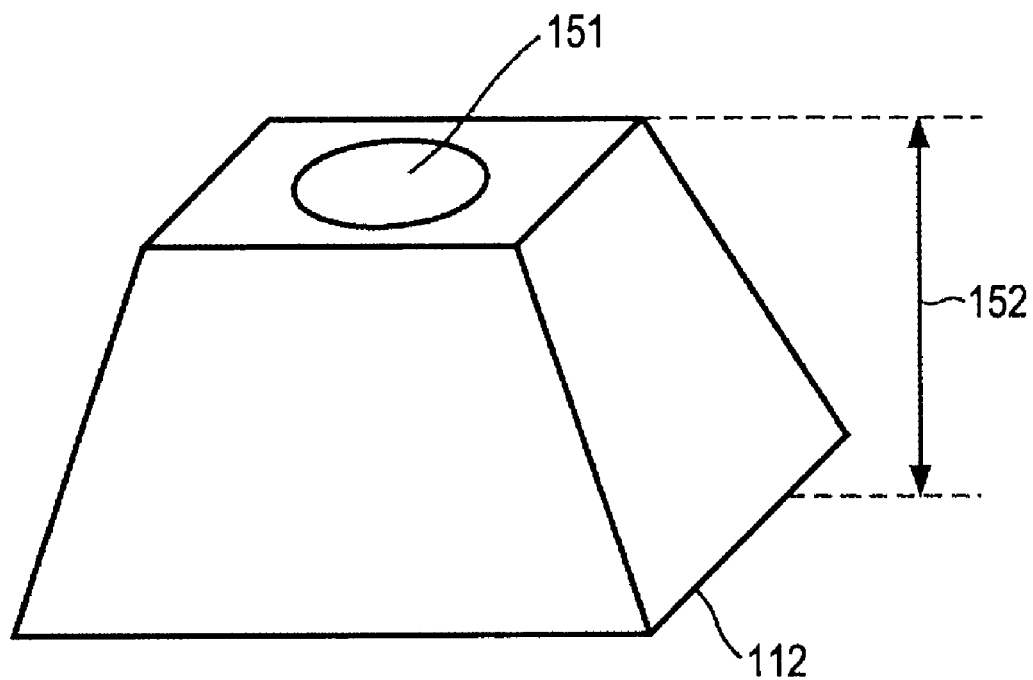
FIGS. 4A and 4B are perspective views showing an example of a substrate securing base and an example of a reinforcing-plate placement base, respectively.

FIG. 4A is an enlarged view of each substrate securing base 112 shown in FIG. 3. As shown in FIG. 4A, the substrate securing base 112 has a three-dimensional shape having a height indicated by an upward downward arrow 152. The substrate securing base 112 is formed by performing sheet-metal processing on the bottom face of the housing 110. The upper surface of the substrate securing base 112 is configured so that the substrate 120 is placed thereon and is secured thereto by a screw.

As shown in FIG. 4A, a substrate securing hole 151 that serves as a threaded hole for securing the substrate 120 may be pre-formed in the substrate securing base 112. In this case, when the substrate 120 is secured to the housing 110, the substrate securing holes 121 in the substrate 120 placed on the substrate securing bases 112 are located on the corresponding substrate securing holes 151 in the substrate securing bases 112. That is, in this state, one substrate securing hole 121 and the corresponding substrate securing hole 151 form one threaded hole. One screw is screwed into the threaded hole (formed by the substrate securing hole 121 and the substrate securing hole 151). Similarly, screws are screwed into the substrate securing holes 121 and the corresponding substrate securing holes 151 in the substrate securing bases 112, so that the substrate 120 is secured to the housing 110. That is, the substrate 120 is secured to a position at a predetermined height (as indicated by the upward downward arrow 152) from the bottom face of the housing 110.

The shapes, the sizes, and the number of substrate securing bases 112 and the height, the position, and so on where the substrate 120 is secured are arbitrary as long as the substrate 120 can be stably secured. The shapes and the sizes of the substrate securing bases 112 may be different from each other. Any method may be used to secure the substrate 120 and a method that does not use screws may be used to secure the substrate 120. Depending on the securing method, the substrate securing holes 151 can be eliminated.

Figure 4B:
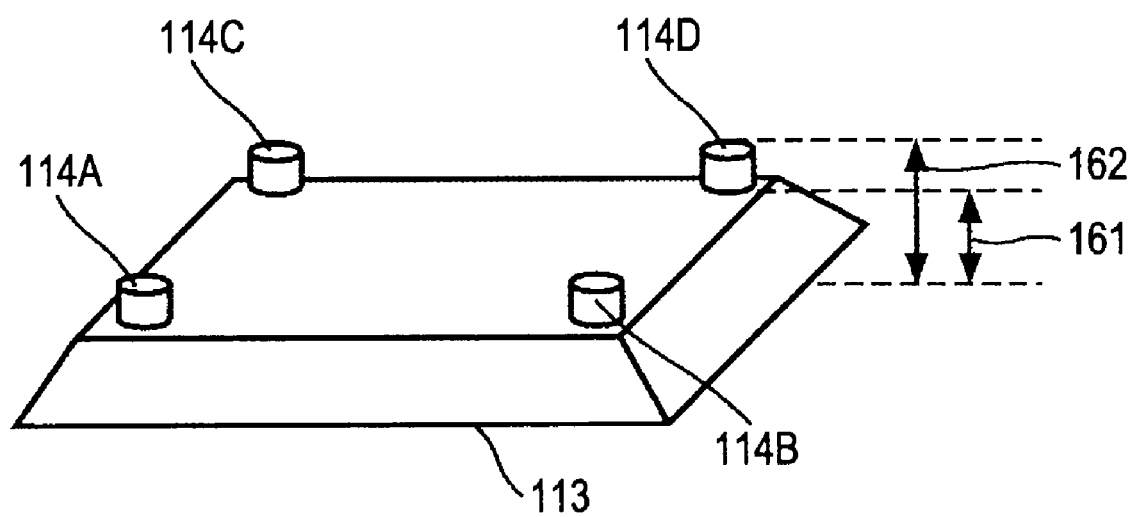

FIG. 4B is an enlarged view of the reinforcing-plate placement base 113 shown in FIG. 3. As shown in FIG. 4B, the reinforcing-plate placement base 113 has a three-dimensional shape with a height indicated by an upward downward arrow 161. The reinforcing-plate placement base 113 is configured so that the reinforcing plate 130 is placed on an upper surface thereof during assembly of the electronic device. As described above, the reinforcing-plate positioning dowels 114 are formed at the upper surface of the reinforcing-plate placement base 113. The reinforcing-plate placement base 113 and the reinforcing-plate positioning dowels 114 are formed by performing sheet-metal processing on the bottom face of the housing 110.

The shapes, the sizes, the number, the positions, and so on of the reinforcing-plate positioning dowels 114 are arbitrary as long as the reinforcing-plate positioning dowels 114 have structures that allow the reinforcing plate 130, placed on the reinforcing-plate placement base 113, to be positioned at a predetermined position and that can be fitted into the reinforcing-plate positioning holes 131. Although one reinforcing-plate positioning dowel 114 is shown in FIG. 4B as having a cylindrical protrusion shape, the reinforcing-plate positioning dowel 114 may have a curved upper surface, such as a circular surface, may have a triangular prism shape, quadratic prism shape, or the like, or may have a circular cone shape, triangular pyramid shape, or the like. The shapes and the sizes of the reinforcing-plate positioning dowels 114 may be different from each other. For example, the thicknesses and the heights of the circular-cylinder reinforcing-plate positioning dowels 114 shown in FIG. 4B may be different from each other.

When the reinforcing plate 130 is placed on the reinforcing-plate placement base 113, the reinforcing plate 130 is situated at a height, indicated by the upward downward arrow 161, from the bottom face of the housing 110. As described below, the substrate 120 is secured to the housing 110 with the substrate 120 being located on the reinforcing plate 130. Thus, the height (indicated by an upward downward arrow 162) of upper surfaces of the reinforcing-plate positioning dowels 114 from the bottom face of the housing 110 is limited to a height that is smaller than the height of the substrate securing bases 112 (indicated by the upward downward arrow 152 in FIG. 4A) so that the reinforcing-plate positioning dowels 114 do not become obstacles to securing of the substrate 120 to the housing 110.

Figure 5:
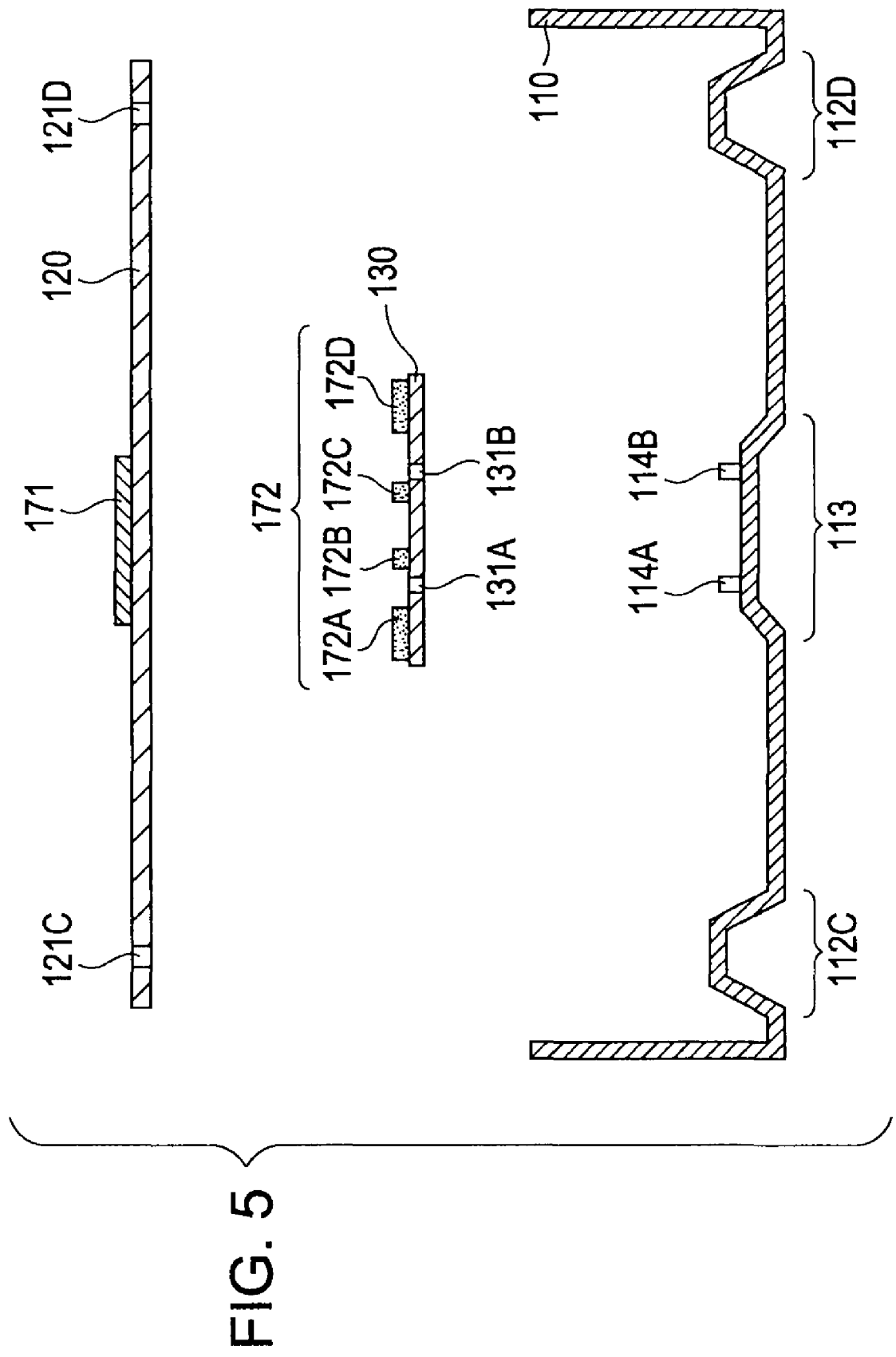
FIG. 5 is a cross sectional view showing an example of the internal configuration of the electronic device according to the embodiment of the present invention.

Assembly of such an electronic device will now be described with reference to FIGS. 5 to 6C. FIG. 5 is a cross sectional view, taken along a long dashed double-short dashed line 141 shown in FIG. 3, of the configuration of members of the electronic device during assembly.

A description below is given of a case in which the housing 110, the substrate 120, and the reinforcing plate 130 are assembled, as shown in FIG. 5. More specifically, the worker secures the reinforcing plate 130 to a position that lies at the back surface (the lower surface in FIG. 5) of the substrate 120 and that corresponds to an IC 171 disposed on an obverse surface (an upper surface in FIG. 5) of the substrate 120, by inserting screws from the obverse surface, and then secures the resulting substrate 120 to the substrate securing bases 112 of the housing 110. The reinforcing plate 130 is a member for reinforcing the substrate 120, for suppressing bending of the substrate 120, and for reducing the amount of load applied to contacts of the IC 171.

The substrate securing bases 112C and 112D, the reinforcing-plate placement base 113, and the reinforcing-plate positioning dowels 114A and 114B are formed at the lower surface of the substrate 120.

The reinforcing-plate positioning holes 131A and 131B are formed in the reinforcing plate 130 at positions corresponding to the reinforcing plate positioning dowels 114A and 114B. Molds 172A to 172D for preventing the substrate 120 from being damaged during securing of the reinforcing plate 130 to the substrate 120 are formed on a surface of the reinforcing plate 130, the surface facing the substrate 120. The molds 172A to 172D will hereinafter be referred to as "molds 172", unless distinction should be made therebetween.

The substrate securing holes 121C and 121D are provided in the substrate 120 at positions corresponding to the substrate securing bases 112C and 112D.

FIGS. 6A to 6C show assembly of the members having the above-described structures.

First, the worker locates the housing 110 on a workbench and places the reinforcing plate 130 on the reinforcing placement base 113 of the housing 110 so that the reinforcing-plate positioning dowels 114A and 114B fit into the reinforcing-plate positioning holes 131A and 131B, respectively, as shown in FIG. 6A.

Next, as shown in FIG. 6B, the worker locates the substrate 120 at the substrate attachment position 111 with the reinforcing plate 130 being interposed therebetween, and screws a substrate screw 181A into the substrate securing hole 121C and the upper surface of the substrate securing base 112C to secure the substrate 120 to the housing 110. Similarly, the worker screws a substrate screw 181B into the substrate securing hole 121D and an upper surface of the substrate securing base 121D to secure the substrate 120 to the housing 110.

In this state, the positional relationship between the substrate 120 and the reinforcing plate 130 is defined by the housing 110. That is, the reinforcing plate 130 is held at a position that is a predetermined position on the substrate 120 and that corresponds to the IC 171.

Thus, as shown in FIG. 6C, when the worker places the heat sink 182 on the IC 171 and attaches the heat sink 182 by heat-sink screws 183A and 183B, the heat-sink screws 183A and 183B are screwed in the reinforcing plate 130 through the substrate 120 and the molds 172. That is, the heat sink 182 and the reinforcing plate 130 are secured to the substrate 120 by the heat-sink screws 183A and 183B so as to sandwich the IC 171.

As described above, the housing 110 has the substrate securing bases 112, which position the substrate 120 at a predetermined position in the housing 110, and the reinforcing-plate placement base 113 and the reinforcing-plate positioning dowels 114, which position the reinforcing plate 130 at a predetermined position in the housing 110 before the reinforcing plate 130 is secured to the substrate 120. In other words, when the reinforcing plate 130 is secured to the substrate 120 during the assembly process of the electronic device, the substrate securing bases 112, the reinforcing-plate placement base 113, and the reinforcing-plate positioning dowels 114 of the housing 110 position the reinforcing plate 130 at a predetermined position relative to the substrate 120 before the reinforcing plate 130 is secured to the substrate 120.

By using such a housing 110, the worker can easily secure the reinforcing plate 130 to a predetermined position on the back surface of the substrate 120 without using a jig and without changing a working surface, such as reversing the substrate 120. That is, the housing 110 has the substrate securing bases 112 and the reinforcing-plate placement base 113 and can define the positional relationship between a first member (the substrate 120) and a second member (the reinforcing plate 130). Thus, by using the housing 110, the worker can easily secure, for example, a second member to a predetermined position that lies at a first member and that is invisible from the worker.

Thus, it is possible to eliminate arrangements, such as management of jigs, a storage place of the jigs, provision of a work place, preparation, and cleanup, and it is possible to reduce the time and space for work for the assembly process for electronic devices. Consequently, it is possible to reduce the production cost of the electronic devices.

Any method may be used to secure the reinforcing plate 130 to the substrate 120 and a method that does not use screws may also be used. The heat sink 182 is a member for releasing heat generated by the IC 171, and can be eliminated if the heat generated by the IC 171 is sufficiently low.

In addition, the reinforcing plate 130 may be attached to the substrate 120 by screws so that the reinforcing plate 130 floats above the reinforcing-plate placement base 113. That is, the arrangement may also be such that, when the reinforcing plate 130 is secured to the substrate 120, the reinforcing plate 130 and the substrate 120 are in close contact with each other with the molds 172 being interposed therebetween and the reinforcing plate 130 and the reinforcing placement base 113 (the housing 110) are spaced apart from each other. Provision of such a gap between the reinforcing plate 130 and the housing 110 can reduce the amount of load applied to the reinforcing plate 130, the application being caused by bending of the housing 110, and also can reduce the amount of load applied to terminals of the IC 171.

Although the above description has been given of a case in which the second member secured to the substrate 120 (the first member) is the reinforcing plate 130, the second member attached to the substrate 120 may be any member, for example, a heat sink, an electronic component, or the like. Thus, the IC 171 can also be eliminated. The first member to which the second member is secured may also be any member and may be a member other than a wiring substrate.

Although the above description has been given of a case in which one second member (the reinforcing plate 130) is secured to one first substrate (the substrate 120), the number of first members and the number of second members are arbitrary. Thus, the number of reinforcing-plate placement bases 113 is also arbitrary. Needless to say, multiple reinforcing plates 130 may be placed on one reinforcing-plate placement base 113, or multiple reinforcing-plate placement bases 113 may be provided so that at least one or all thereof hold the position(s) of the reinforcing plate(s) 130.

In addition, for example, multiple reinforcing-plate placement bases 113 may be provided or more reinforcing-plate positioning dowels 114 than the reinforcing-plate positioning holes 131 in the reinforcing plate 130 may be provided at the reinforcing-plate placement base(s) 113 so that one reinforcing plate 130 can be located at multiple positions relative to the substrate 120 or the worker can locate one reinforcing plate 130 at a selectively determined one of the multiple positions. With such a configuration, the housing 110 allows the reinforcing plate 130 to be easily secured to multiple types of substrate 120, as described above. That is, the housing 110 can be used for multiple types of electronic device and allows the assembly process to be easily performed as described above.

Although the above description has been given of a case in which the reinforcing-plate placement base 113 performs vertical positioning of the reinforcing plate 130 relative to the substrate 120 and the reinforcing-plate positioning dowels 114 perform horizontal positioning of the reinforcing plate 130 relative to the substrate 120, any structure may be used to perform vertical and horizontal positioning of the reinforcing plate 130. For example, a predetermined bump/dip, such as a groove, may be provided at the upper surface of the reinforcing-plate placement base 113 so as to allow the reinforcing plate 130 to be stably placed only at a predetermined horizontal position (i.e., so as to perform horizontal positioning of the reinforcing plate 130 relative to the substrate 120). Needless to say, any other method may also be used.

Figure 7A:
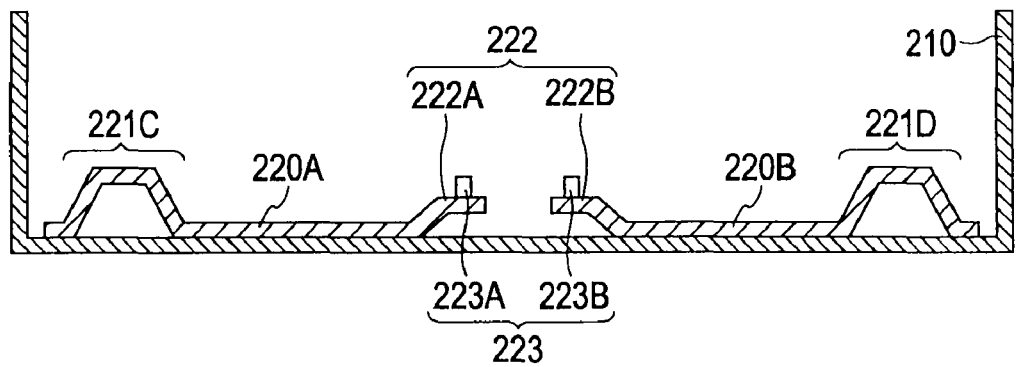
FIGS. 7A to 7C are cross sectional views showing another example of the internal configuration of the electronic device according to the embodiment of the present invention.
Figure 7B:
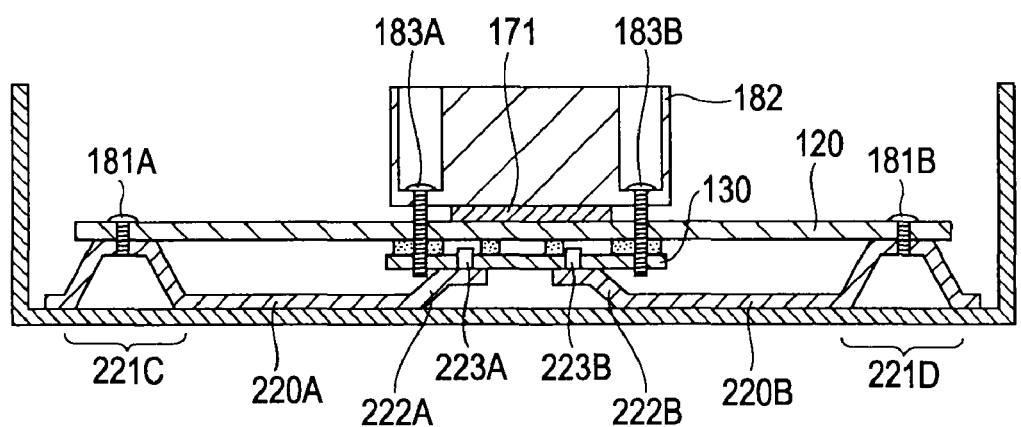
Figure 7C:
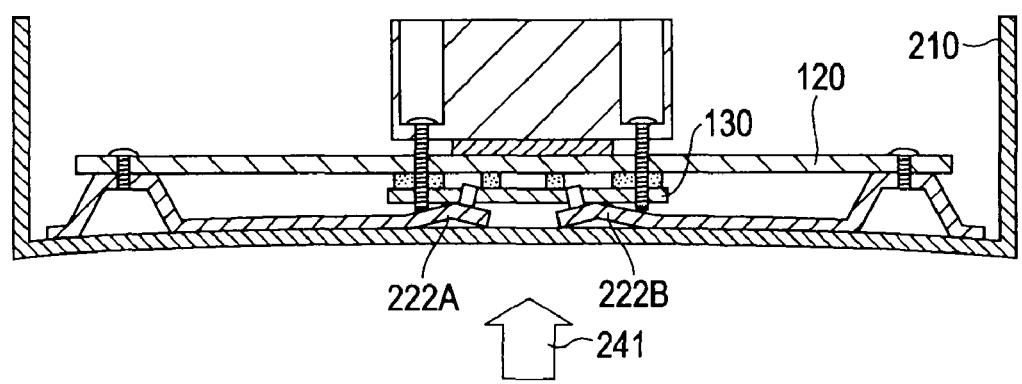

In addition, the structure for defining the positional relationship between the first member and the second member may be a structure that is independent from the housing 110. FIGS. 7A to 7C are cross sectional views showing an example of such a configuration. An electronic device shown in FIGS. 7A to 7C has generally the same configuration as the electronic device shown in FIG. 3. FIGS. 7A to 7C are cross sectional views at a position, taken along the long dashed double-short dashed line 141 in FIG. 3, of the electronic device, as in the case of FIGS. 5 to 6C.

In the example of FIGS. 7A to 7C, the substrate securing bases and the reinforcing-plate placement base are formed at a member (a placement base) that is disposed on the bottom face and that is independent from the housing. In FIG. 7A, placement bases 220A and 220B are disposed on a bottom face of a housing 210. The placement base 220A has a substrate securing base 221C and a reinforcing-plate placement base 222A and the placement base 220B has a substrate securing base 221D and a reinforcing-plate placement base 222B. As in the example of FIG. 3, a reinforcing-plate positioning dowel 223A is formed at an upper surface of the reinforcing-plate placement base 222A and a reinforcing-plate positioning dowel 223B is formed at an upper surface of the reinforcing-plate placement base 222B.

The reinforcing-plate placement base 222A and the reinforcing-plate placement base 222B shown as being two separated portions in FIG. 7A are, in practice, portions of one reinforcing-plate placement base 222, in which one opening is provided in its approximate center.

Similarly, in practice, the placement bases 220A and 220B are also formed as one placement base 220, and thus, the placement bases 220A and 220B shown in FIG. 7A are portions of the placement base 220.

FIG. 7A shows only portions that lie on the long dashed double-short dashed line 141. Substrate securing bases 221A to 221H (only the substrate securing bases 221C and 221D are shown in FIG. 7A) are formed on the placement base 220, in the same manner as the example shown in FIG. 3. Similarly, reinforcing-plate positioning dowels 223A to 223D (only the reinforcing-plate positioning dowels 223A and 223B are shown) are formed at the reinforcing-plate placement base 222.

The substrate securing bases 221A to 221H will hereinafter be referred to as "substrate securing bases 221", unless distinction should be made therebetween. Similarly, the reinforcing-plate positioning dowels 223A to 223D are referred to as "reinforcing-plate positioning dowels 223", unless distinction should be made therebetween.

The substrate securing bases 221 are similar to the substrate securing bases 112 in the example described above with reference to FIGS. 3 to 6C. The substrate securing bases 221 serve as members for positioning, when the substrate 120 is secured thereto, the substrate 120 at a predetermined position in the housing 110 (i.e., for controlling the horizontal and vertical positions of the substrate 120). In other words, the substrate securing bases 221 perform vertical and horizontal positioning of the substrate 120 relative to the housing 110.

The reinforcing-plate placement base 222 is similar to the reinforcing-plate placement base 113 in the example described above with reference to FIGS. 3 to 6C. The reinforcing-plate placement base 222 serves as a member for positioning, when the reinforcing plate 130 is placed thereon, the reinforcing plate 130 at a predetermined height in the housing 110 (i.e., for controlling the vertical position of the reinforcing plate 130). In other words, the reinforcing-plate placement base 222 performs vertical positioning of the reinforcing plate 130 relative to the substrate 120.

In addition, the reinforcing-plate positioning dowels 223 are similar to the reinforcing-plate positioning dowels 114 in the example described above with reference to FIGS. 3 to 6C. The reinforcing-plate positioning dowels 223 are disposed so as to position, when the reinforcing-plate positioning dowels 223 are fitted into the corresponding reinforcing-plate positioning holes 131 and the reinforcing plate 130 is placed on the reinforcing-plate placement base 222, the reinforcing plate 130 at a predetermined position in the housing 110 (i.e., so as to control the horizontal position of the reinforcing plate 130). That is, the reinforcing-plate positioning dowels 223 perform horizontal positioning of the reinforcing plate 130 relative to the substrate 120.

Basically, assembly in this case is also performed as in the case described with reference to FIGS. 5 to 6C. That is, the worker places the reinforcing plate 130 on the reinforcing-plate placement base 222 so that the reinforcing-plate positioning dowels 223 fit into the corresponding reinforcing-plate positioning holes 131, places the substrate 120 on the substrate securing bases 221, and secures the substrate 120 to the substrate securing bases 221 by the substrate screws 181A and 181B. In addition, the worker places the heat sink 182 on the IC 171 and secures the heat sink 182 and the reinforcing plate 130 to the substrate 120 by the heat-sink screws 183A and 183B so that the heat sink 182 and the reinforcing plate 130 sandwich the IC 171. FIG. 7B shows the resulting structure.

As shown in FIG. 7B, a method for securing the substrate 120, the reinforcing plate 130, and so on is generally analogous to that in the above-described example shown in FIG. 6C.

In the example shown in FIGS. 7A to 7C, however, the bottom face of the housing 210 and the placement base 220 are configured as independent portions. When the substrate securing bases, the reinforcing-plate placement base, and so on are formed by deforming the bottom face of the housing, as described above with reference to FIGS. 3 to 6C, the strength of the housing (i.e., the bottom face thereof) may decrease. In contrast, in the example shown in FIGS. 7A to 7C, since the bottom face of the housing 210 is not deformed, it is possible to suppress a reduction in the strength. Instead, it is possible to further improve the strength since the structure is doubled by the housing 210 and the placement base 220.

In addition, in the example shown in FIGS. 7A to 7C, the reinforcing-plate placement base 222 has a large opening in its approximate center, and thus, the reinforcing-plate placement base 222 is more flexible and is more easily deformed than the bottom face of the housing 210. As a result, even when a pressure is applied from below (indicated by an arrow 241) to the bottom face of the housing 210, as shown the FIG. 7C, the reinforcing-plate placement base 222 is deformed to absorb the load of the pressure. Thus, it is possible to reduce the amount of load applied to the reinforcing plate 130, i.e., the terminals of the IC 171.

As described above, at least one portion of the reinforcing-plate placement base 222 or the entire reinforcing-plate placement base 222 of the placement base 220 may have a structure that is more flexible and more easily deformed than the bottom face of the housing 210. Naturally, any other structure may also be employed. For example, at least one portion of the reinforcing-plate placement base 222 or the entire reinforcing-plate placement base 222 of the placement base 220 may be made thinner than the thickness of the bottom face of the housing 210 so that the reinforcing-plate placement base 222 has a structure that is more flexible and more easily deformed than the bottom face of the housing 210. Any other method may also be employed.

Material instead of the structure may be changed so as to cause the reinforcing-plate placement base 222 to be more flexible and more easily deformed than the bottom face of the housing 210. For example, the bottom face of the housing 210 may be made of solid metal such as stainless, whereas at least one portion of the reinforcing-plate placement base 222 or the entire reinforcing-plate placement base 222 of the placement base 220 may be made of flexible material, such as aluminum, plastic, or rubber.

As described above, the placement base 220 disposed in the housing 210 has the substrate securing bases 221, which position the substrate 120 at a predetermined position in the housing 110, and the reinforcing-plate placement base 222 and the reinforcing-plate positioning dowels 223, which position the reinforcing plate 130 at a predetermined position in the housing 110 before the reinforcing plate 130 is secured to the substrate 120. In other words, when the reinforcing plate 130 is secured to the substrate 120 in the assembly process of the electronic device, the substrate securing bases 221, the reinforcing-plate placement base 222, and the reinforcing-plate positioning dowels 223 of the placement base 220 position the reinforcing plate 130 at a predetermined position relative to the substrate 120 before the reinforcing plate 130 is secured to the substrate 120.

Using the housing 210 and the placement base 220, the worker can easily secure the reinforcing plate 130 to a predetermined position on the back surface of the substrate 120 without using a jig and without changing a working surface, such as reversing the substrate 120.

That is, the placement base 220 has the substrate securing bases 221 and the reinforcing-plate placement base 222 and can define the positional relationship between the first member and the second member. Thus, using the housing 210 in which the placement base 220 is disposed, the worker can easily secure, for example, a second member to a predetermined position that lies at a first member and that is invisible from the worker.

Thus, it is possible to eliminate arrangements, such as management of jigs, a storage place of the jigs, provision of a work place, preparation, and cleanup, and it is possible to reduce the time and space for work for the assembly process for electronic devices. Consequently, it is possible to reduce the production cost of the electronic devices.

Since the housing 210 and the placement base 220 are configured as independent portions, the work for assembling the first member, the second member, and the placement base 220 can be performed outside the housing 210. Thus, the worker can easily perform the assembly work.

As in the example described with reference to FIGS. 3 to 6C, any method may be used to secure the reinforcing plate 130 to the substrate 120 and a method that does not use screws may be used. The heat sink 182 and the IC 171 can also be eliminated. In addition, the reinforcing plate 130 may be attached to the substrate 120 by screws so that the reinforcing plate 130 floats above the reinforcing-plate placement base 222.

The first member and the second member may be any members and the number of first members and the number of second members are also arbitrary. The number of reinforcing-plate placement bases 222 is also arbitrary, as in the example described above with reference to FIGS. 3 to 6C.

In addition, any method may be used to secure the housing 210 and the placement base 220. As in the example described above with reference to FIGS. 3 to 6C, the shapes, the sizes, and the number of substrate securing bases 221 and the height, the position, and so on where the substrate 120 is secured are arbitrary as long as the substrate 120 can be stably secured. The shapes and the sizes of the substrate securing bases 221 may be different from each other. In addition, any method may be used to secure the substrate 120 to the substrate securing bases 221.

The shapes, the sizes, the number, the positions, and so on of the reinforcing-plate positioning dowels 223 are arbitrary as long as the reinforcing-plate positioning dowels 223 have structures that can position, at a predetermined position, the reinforcing plate 130 placed on the reinforcing-plate placement base 222 and that can be fitted into the reinforcing-plate positioning holes 131. In addition, the shapes and the sizes of the reinforcing-plate positioning dowels 223 may be different from each other.

The above-described structure (the reinforcing-plate placement base) that is provided at the housing or the placement base to define the position of the second member is not used in the electronic device after the assembly is completed. Thus, a jig other than the electronic device may be used to position the reinforcing plate (the second member) at a predetermined position in the housing relative to the substrate (the first member).

Figure 8:
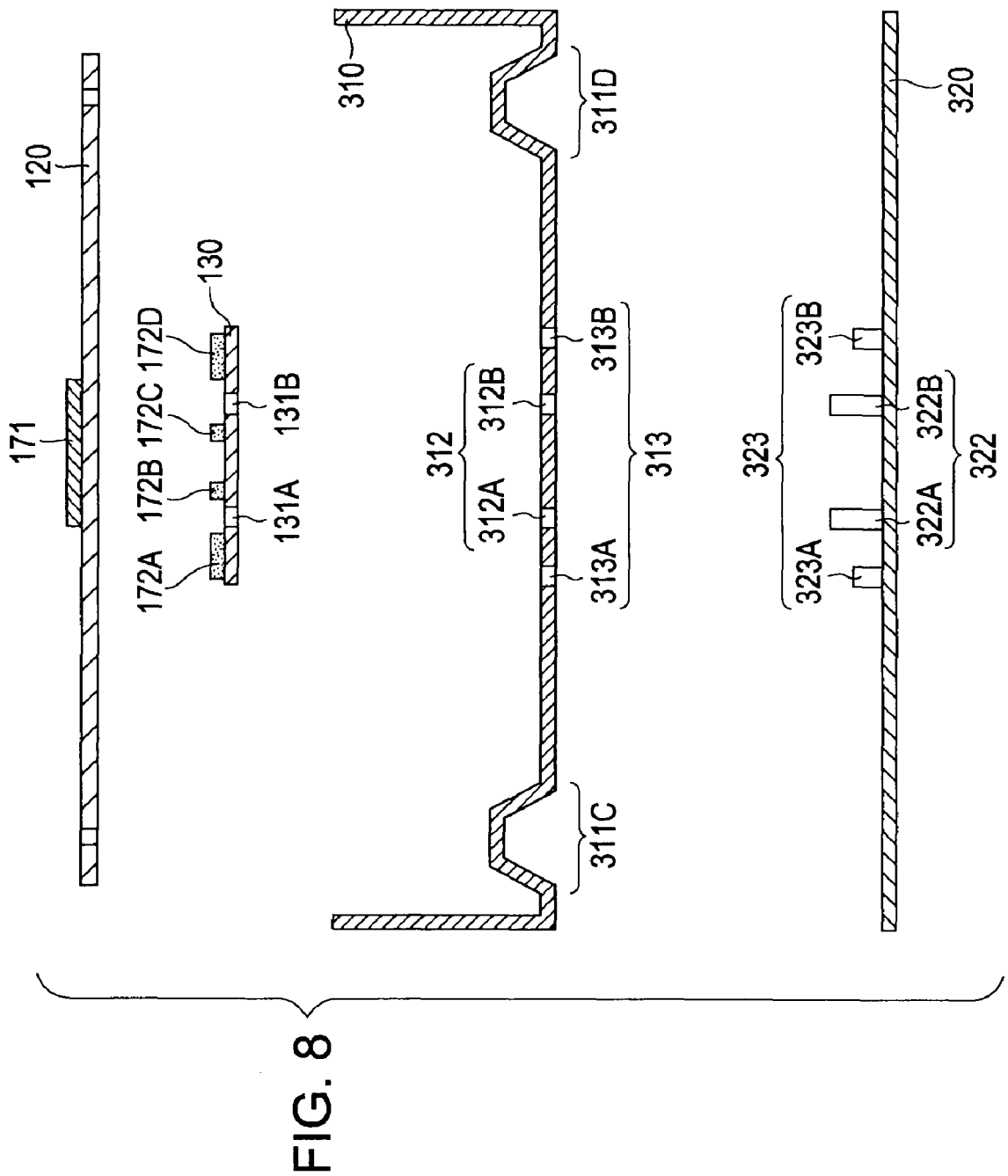
FIG. 8 is a cross sectional view showing another example of the internal configuration of the electronic device according to the embodiment of the present invention.

FIG. 8 shows an example of the configuration of a portion of an electronic device in such a case and corresponds to FIGS. 5 and 7A. More specifically, FIG. 8 is a cross sectional view, taken along the long dashed double-short dashed line 141 shown in FIG. 3, of the electronic device. The electronic device shown in FIG. 8 generally has a configuration that is similar to the electronic device shown in FIG. 3.

In the case of the example shown in FIG. 8, substrate securing bases 311C and 311D on which a substrate 120 is to be placed are provided at a bottom face of a housing 310, in the same manner as the housing 110 in the example described with reference to FIGS. 3 to 6C and as the placement base 220 in the example described with reference to FIGS. 7A to 7C. However, unlike the housing 110 in the example described with reference to FIGS. 3 to 6C and the placement base 220 in the example described with reference to FIGS. 7A to 7C, reinforcing-plate horizontal positioning holes 312A and 312B and reinforcing-plate vertical positioning holes 313A and 313B are provided at predetermined positions of the bottom face of the housing 310, instead of the reinforcing-plate placement bases for determining the position of the reinforcing plate 130 (the second member).

In the example of FIG. 8, a jig 320 is further used in assembly work. A reinforcing-plate horizontal positioning pin 322A to be fitted into the reinforcing-plate horizontal positioning hole 312A, a reinforcing-plate horizontal positioning pin 322B to be fitted into the reinforcing-plate horizontal positioning hole 312B, a reinforcing-plate vertical positioning pin 323A to be fitted into the reinforcing-plate vertical positioning hole 313A, and a reinforcing-plate vertical positioning pin 323B to be fitted into the reinforcing-plate vertical positioning hole 313B are provided at an upper surface of the jig 320 at positions corresponding to the respective holes 312A, 312B, 313A, and 313B.

The reinforcing-plate horizontal positioning pins 322A and 322B are pins for defining the horizontal position of the reinforcing plate 130 during placement of the reinforcing plate 130, and are fitted into the corresponding reinforcing-plate positioning holes 131A and 131B in the reinforcing plate 130.

The reinforcing-plate vertical positioning pins 323A and 323B are pins for defining the vertical position of the reinforcing plate 130 during placement of the reinforcing plate 130. When the reinforcing plate 130 is placed, upper surfaces of the reinforcing-plate vertical positioning pins 323A and 323B support a lower surface of the reinforcing plate 130.

When the housing 310 is placed on the jig 320, the pins 322A, 322B, 323A, and 323B define the position of the reinforcing plate 130. Details of such a mechanism will be described below.

FIG. 8 shows only portions that lie on the long dashed double-short dashed line 141 shown in FIG. 3. Reinforcing-plate horizontal positioning holes 312A to 312D (the reinforcing-plate horizontal positioning holes 312C and 312D are not shown) are formed in the bottom face of the housing 310, as in the reinforcing-plate positioning dowels in the example shown in FIG. 3. Similarly, reinforcing-plate horizontal positioning pins 322A to 322D (the reinforcing-plate horizontal positioning pins 322C and 322D are not shown) are formed at the jig 320.

Substrate securing bases 311A to 311H (only the substrate securing bases 311C and 311D are shown in FIG. 8) are formed at the bottom face of the housing 310, in the same manner as the example shown in FIG. 3.

The substrate securing bases 311A to 311H are referred to as "substrate securing bases 311", unless distinction should be made therebetween. Similarly, the reinforcing-plate horizontal positioning holes 312A to 312D are referred to as "reinforcing-plate horizontal positioning holes 312", unless distinction should be made therebetween, and the reinforcing-plate vertical positioning holes 313A and 313B are referred to as "reinforcing-plate vertical positioning holes 313", unless distinction should be made therebetween. Similarly, the reinforcing-plate horizontal positioning pins 322A to 322D are referred to as "reinforcing-plate horizontal positioning pins 322", unless distinction should be made therebetween, and the reinforcing-plate vertical positioning pins 323A to 323B are referred to as "reinforcing-plate vertical positioning pins 323", unless distinction should be made therebetween.

The substrate securing bases 311 are similar to the substrate securing bases 112 described in the above example with reference to FIGS. 3 to 6C. The substrate securing bases 311 serve as members for positioning, when the substrate 120 is secured thereto, the substrate 120 at a predetermined position in the housing 110 (i.e., for controlling the horizontal and vertical positions of the substrate 120). In other words, the substrate securing bases 311 perform vertical and horizontal positioning of the substrate 120 relative to the housing 110.

The reinforcing-plate vertical positioning pins 323 (the reinforcing-plate vertical positioning holes 313) have a function that is similar to the reinforcing-plate placement bases 113 described in the above example with reference to FIGS. 3 to 6C. The reinforcing-plate vertical positioning pins 323 serve as members for positioning, when the reinforcing plate 130 is placed thereon, the reinforcing plate 130 at a predetermined height in the housing 110 (i.e., for controlling the vertical position of the reinforcing plate 130). In other words, the reinforcing-plate vertical positioning pins 323 (the reinforcing-plate vertical positioning holes 313) perform vertical positioning of the reinforcing plate 130 relative to the substrate 120.

In addition, the reinforcing-plate horizontal positioning pins 322 (the reinforcing-plate horizontal positioning holes 312) have a function that is similar to the reinforcing-plate positioning dowels 114 in the example described above with reference to FIGS. 3 to 6C. The reinforcing-plate horizontal positioning pins 322 are disposed so as to position, when the reinforcing-plate vertical positioning pins 322 are fitted into the corresponding reinforcing-plate positioning holes 131 and the reinforcing plate 130 is placed on the reinforcing-plate vertical positioning pins 323, the reinforcing plate 130 at a predetermined position in the housing 110 (i.e., for controlling horizontal positioning of the reinforcing plate 130). That is, the reinforcing-plate horizontal positioning pins 322 (the reinforcing-plate horizontal positioning holes 312) perform horizontal positioning of the reinforcing plate 130 relative to the substrate 120.

Figure 9A:
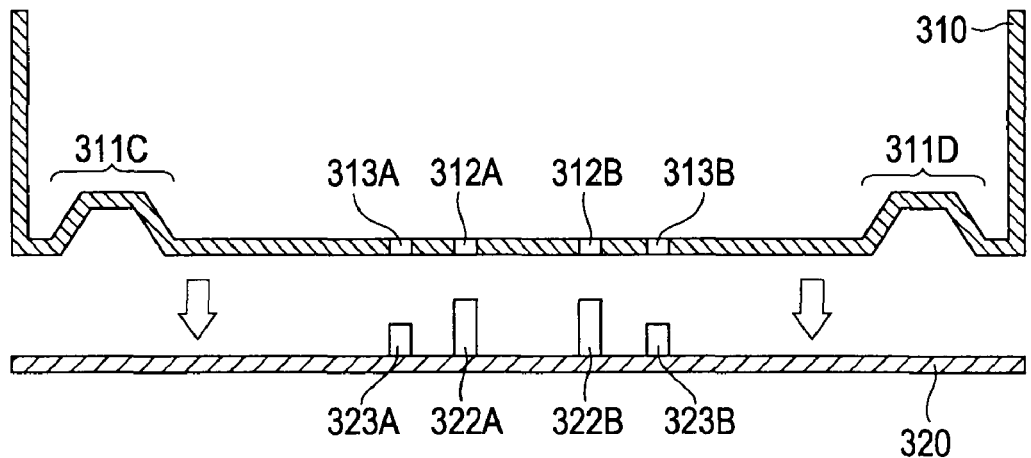
FIGS. 9A to 9C are cross sectional views illustrating an example of assembly of the electronic device shown in FIG. 8.

An assembly method in this case will now be described with reference to FIGS. 9A to 10B. First, the worker places the jig 320 on a workbench, and disposes the housing 310 on the jig 320, as shown in FIG. 9A. At this point, since the reinforcing-plate horizontal positioning pins 322 and the reinforcing-plate vertical positioning pins 323 of the jig 320 are located so as to fit into the reinforcing-plate horizontal positioning holes 312 and the reinforcing-plate vertical positioning holes 313 of the housing 310, respectively, the housing 310 is positioned at a predetermined position relative to the jig 320.

Figure 9B:
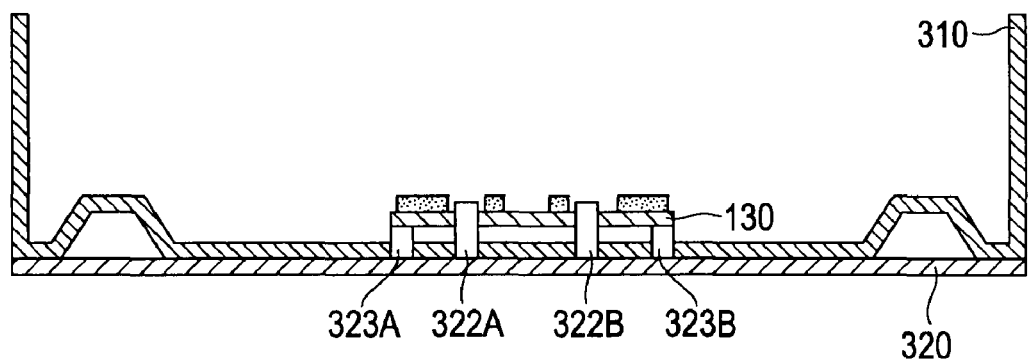
Figure 9C:
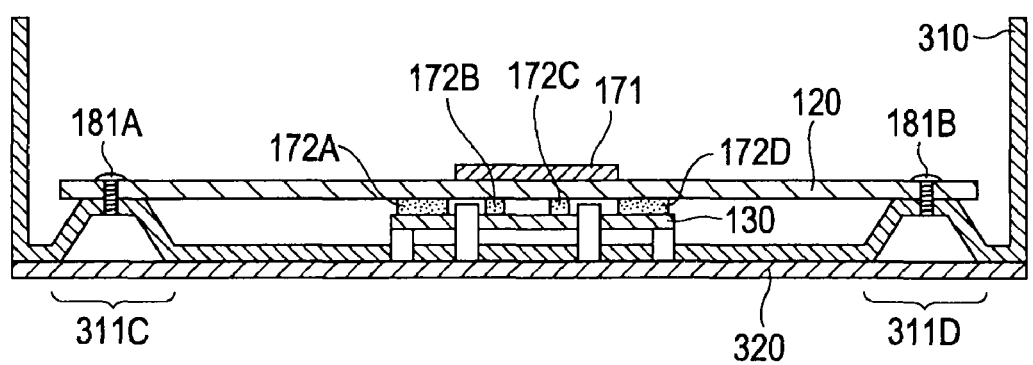

In this state, the reinforcing-plate horizontal positioning pins 322 and the reinforcing-plate vertical positioning pins 323 of the jig 320 project to the inside of the housing 310 through the bottom face of the housing 310. The worker then places the reinforcing plate 130, as shown in FIG. 9B. At this point, the reinforcing plate 130 is placed on the reinforcing-plate vertical positioning pins 323 of the jig 320 so that the reinforcing-plate horizontal positioning pins 322 of the jig 320 fit into the reinforcing-plate positioning holes 131 of the reinforcing plate 130. That is, the reinforcing-plate vertical positioning pins 323 define the vertical position (the height) of the reinforcing plate 130 and the reinforcing-plate horizontal positioning pins 322 define the horizontal position of the reinforcing plate 130. Consequently, the reinforcing plate 130 is held at a predetermined position relative to the jig 320, i.e., the housing 310.

Next, the worker places the substrate 120 on the substrate securing bases 311 of the housing 310 with the reinforcing plate 130 being interposed therebetween and secures the substrate 120 to the housing 310 (the substrate securing bases 311) by the substrate screws 181 (the substrate screws 181A and 181B).

That is, the height of the reinforcing-plate horizontal positioning pins 322 from the bottom face of the housing 310 is set lower than the height of the substrate securing bases 311. The height of the reinforcing-plate vertical positioning pins 323 from the bottom face of the housing 310 is also set so that the highest portion of the reinforcing plate 130 placed thereon is lower than the height of the substrate securing bases 311.

As described above, the substrate 120 is secured to a predetermined position relative to the housing 310. That is, the relative position between the substrate 120 and the reinforcing plate 130 is defined to have a predetermined relationship. Thus, the reinforcing plate 130 is held at a position corresponding to the IC 171 of the substrate 120.

Figure 10A:
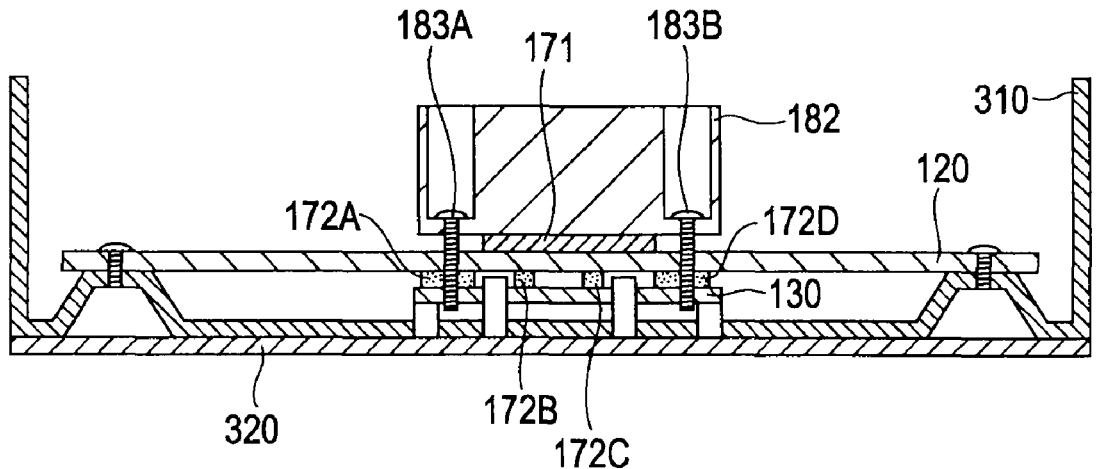
FIGS. 10A and 10B are cross sectional views illustrating an example of assembly of the electronic device shown in FIG. 8, the assembly shown in FIG. 10A following the assembly shown in FIG. 9C.

The worker places the heat sink 182 on the IC 171 on the substrate 120 and secures the heat sink 182 and the reinforcing plate 130 to the substrate 120 by the heat-sink screws 183A and 183B so that the heat sink 182 and the reinforcing plate 130 sandwich the IC 171. FIG. 10A shows the resulting structure.

Figure 10B:
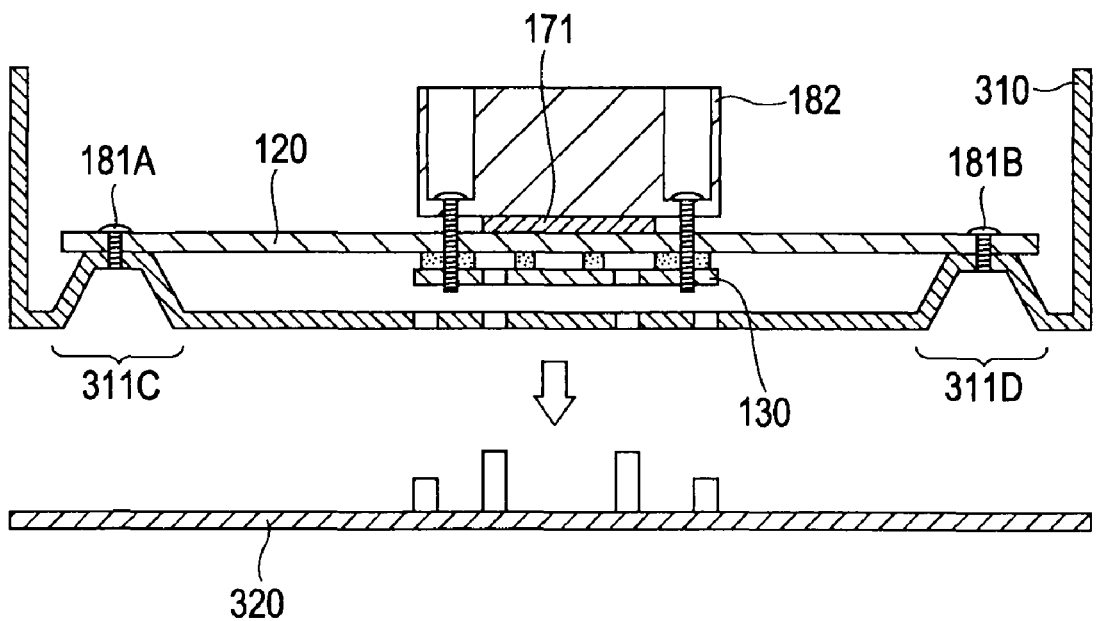

Upon completing such an assembly process in which the substrate 120 is secured to the housing 310, the worker removes the housing 310 from the jig 320 (which is not a portion of the electronic device) to complete the work, as shown in FIG. 10B.

That is, the housing 310 has the structure (the substrate securing bases 311) for defining the position of the first member (the substrate 120) and portions (the reinforcing-plate horizontal positioning holes 312 and the reinforcing-plate vertical positioning holes 313) of the structure for defining the position of the second member (the reinforcing plate 130). The jig 320 has portions (the reinforcing-plate horizontal positioning pins 322 and the reinforcing-plate vertical positioning pins 323) of the structure for defining the position of the second member. That is, the combination of the housing 310 and the jig 320 defines the relative position between the first member and the second member (i.e., performs positioning thereof) Providing the jig 320 with the portions of the above-described structure in such a manner allows the structure (the reinforcing-plate positioning pins, the reinforcing-plate placement base, and so on in the example shown in FIG. 3) for defining the position of the reinforcing plate 130 to be eliminated from the completed product. As a result, for example, this arrangement can eliminate a need for ensuring the height of the reinforcing-plate placement base, and thus makes it possible to design a lower-profile (smaller) housing of an electronic device. Also, it is sufficient to only provide the reinforcing-plate positioning holes and thus it is easy to process the bottom face of the housing 310. It is also possible to reduce the work time and the production cost and it is also possible to also to suppress a strength reduction due to the processing. In addition, in the completed product, the reinforcing-plate positioning holes can be used as openings for releasing heat.

In this case, although the worker uses the jig in the assembly work, he or she can perform the assembly work within the housing 310. Thus, unlike the related art described above with reference to FIGS. 2A to 2D, without removing the jig during the assembly work or without changing a working surface, such as reversing the substrate 120, the worker can easily define the positional relationship between the first member and the second member and can secure the reinforcing plate 130 to a predetermined position that lies at the back surface of the substrate 120 and that is invisible from the worker.

Thus, it is possible to reduce the time and space used for work for the assembly process of the electronic device, and it is possible to reduce the production cost of the electronic device.

Although the above description has been given of a case in which both the reinforcing-plate horizontal positioning pins 322 and the reinforcing-plate vertical positioning pins 323 are provided at the jig 320, either the reinforcing-plate horizontal positioning pins 322 or the reinforcing-plate vertical positioning pins 323 may be formed by performing sheet-metal processing on the bottom face of the housing 310 or by providing other members at the bottom face of the housing 310. In addition, the arrangement may be such that the reinforcing-plate vertical positioning holes 313 in the housing 310 and the reinforcing-plate vertical positioning pins 323 of the jig 320 are eliminated and the reinforcing plate 130 is placed on the bottom face of the housing 310. In such a case, the reinforcing plate 130 may be attached to the substrate 120 by screws so that the reinforcing plate 130 floats above the bottom face of the housing 310.

As in the case of the example described above with reference to FIGS. 3 to 6C, the shapes, the sizes, and the number of substrate securing bases 311 and the height, the position, and so on where the substrate 120 is secured are arbitrary as long as the substrate 120 can be stably secured. The shapes and the sizes of the substrate securing bases 311 may also be made different from each other. In addition, any method may be used to secure the substrate 120 to the substrate securing bases 311.

As in the case of the reinforcing-plate positioning dowels, the shapes, the sizes, the number, and the positions, and so on of the reinforcing-plate horizontal positioning pins 322 and the reinforcing-plate vertical positioning pins 323 are arbitrary, as long as they have structures that can be fitted into the corresponding reinforcing-plate horizontal positioning holes 312 and the reinforcing-plate vertical positioning hole 313 and that can hold the reinforcing plate 130 at a predetermined position. In addition, the shapes and the sizes of the pins 322 and 323 may also be different from each other.

As in the example described above with reference to FIGS. 3 to 6C, any method may be used to secure the reinforcing plate 130 to the substrate 120 and a method that does not use screws may be used. The heat sink 182 and the IC 171 can also be eliminated. In addition, the first member and the second member may be any members and the number of first members and the number of second members are also arbitrary.

Although the above description in each example has been given of a case in which the substrate 120 is secured to the bottom face (or the substrate securing bases provided on the bottom face) of the housing, the face to which the substrate 120 is secured (the face at which the substrate securing bases are provided) may be any surface other than the bottom face.

Although the above description in each example has been given of a case in which the vertical and horizontal positioning of the substrate 120 and the reinforcing plate 130 is performed, the directions for such positioning may be any directions in which the relative position between the substrate 120 and the reinforcing plate 130 in space can be controlled. That is, the directions for the positioning may be, for example, two directions including a predetermined first direction (e.g., a vertical direction) and a second direction (e.g., a horizontal direction) that is perpendicular to the first direction. The directions for the control may be any directions, for example, first, second, and third directions that are perpendicular to each other.

Although the above description has been give of an electronic device by way of example, the device may be any device that has a first member and a second member in its housing and that has a structure similar to the above-described electronic device.

The present invention is not limited to the above-described embodiment, and various changes can be made thereto without departing from the spirit and scope of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device comprising:
a housing;
a first member; and
a second member secured to the first member; and
positioning means for positioning the second member at a predetermined position relative to the first member when the second member is secured to the first member in an assembly process of the electronic device, the positioning means including a placement base in contact with the second member, the placement base including a hole located approximately in a center of the placement base, the center of the placement base being located at a point equally distant from sides of the placement base.

2. The electronic device according to claim 1, wherein the positioning means includes
first positioning means for positioning the first member at a predetermined position relative to the housing, and
second positioning means for positioning the second member at the predetermined position relative to the first member positioned at the predetermined position relative to the housing by the first positioning means.

3. The electronic device according to claim 2, wherein the first positioning means includes a securing base that performs positioning on the first member when the first member is secured to the securing base, and
the second positioning means includes the placement base that performs positioning in a first direction on the second member when the second member is placed on the placement base and a protrusion that performs positioning in a second direction on the second member when the protrusion is fitted into a hole provided in the second member, the second direction being perpendicular to the first direction.

4. The electronic device according to claim 1, wherein the positioning means is formed by processing the housing.

5. The electronic device according to claim 1, wherein the positioning means is formed as a portion that is independent from the housing and that is disposed in the housing.

6. The electronic device according to claim 1, wherein a thickness of the placement base is less than a thickness of a bottom face of the housing.

7. The electronic device according to claim 1, wherein the placement base is made of a more flexible material than a material from which the housing is made.

8. An electronic device comprising:
a housing;
a first member;
a second member secured to the first member; and
a positioning portion configured to position the second member at a predetermined position relative to the first member when the second member is secured to the first member in an assembly process of the electronic device, the positioning portion including a placement base in contact with the second member, the placement base including a hole located approximately in a center of the placement base, the center of the placement base being located at a point equally distant from sides of the placement base.

9. The electronic device according to claim 8, wherein the positioning portion includes
a first positioning portion configured to position the first member at a predetermined position relative to the housing, and
a second positioning portion configured to position the second member at the predetermined position relative to the first member positioned at the predetermined position relative to the housing by the first positioning portion.

10. The electronic device according to claim 9, wherein the first positioning portion includes a securing base that performs positioning on the first member when the first member is secured to the securing base, and
the second positioning portion includes the placement base that performs positioning in a first direction on the second member when the second member is placed on the placement base and a protrusion that performs positioning in a second direction on the second member when the protrusion is fitted into a hole provided in the second member, the second direction being perpendicular to the first direction.

11. The electronic device according to claim 8, wherein the positioning portion is formed by processing the housing.

12. The electronic device according to claim 8, wherein the positioning portion is formed as a portion that is independent from the housing and that is disposed in the housing.

13. The electronic device according to claim 8, wherein a thickness of the placement base is less than a thickness of a bottom face of the housing.

14. The electronic device according to claim 8, wherein the placement base is made of a more flexible material than a material from which the housing is made.

* * * * *